United States Patent [19]

Seto et al.

[11] Patent Number: 5,266,816
[45] Date of Patent: Nov. 30, 1993

[54] POLYSILICON THIN FILM SEMICONDUCTOR DEVICE CONTAINING NITROGEN

[75] Inventors: Shunsuke Seto; Hidetoshi Nozaki; Kazushige Mori, all of Yokohama, Japan

[73] Assignee: Kabushiki Kaisha Toshiba, Kawasaki, Japan

[21] Appl. No.: 825,586

[22] Filed: Jan. 24, 1992

[30] Foreign Application Priority Data

Jan. 25, 1991 [JP] Japan ................................. 3-25472

[51] Int. Cl.$^5$ .................. H01L 29/04; H01L 29/167; H01L 29; H01L 784
[52] U.S. Cl. ...................................... 257/65; 257/66; 257/285; 257/914
[58] Field of Search .......................... 357/4, 23.7, 59; 257/64-67, 285, 69, 70, 914

[56] References Cited

U.S. PATENT DOCUMENTS

| | | | |
|---|---|---|---|
| 4,755,865 | 7/1988 | Wilson et al. | 257/66 |
| 4,766,477 | 8/1988 | Nakagawa et al. | 357/4 |
| 4,772,927 | 9/1988 | Saito et al. | 357/63 |
| 4,814,292 | 3/1989 | Sasaki et al. | 437/84 |
| 5,132,754 | 7/1992 | Serikawa et al. | 357/59 |

FOREIGN PATENT DOCUMENTS

| | | | |
|---|---|---|---|
| 0383230 | 8/1990 | European Pat. Off. | 257/57 |
| 0041029 | 2/1988 | Japan | 357/23.7 |
| 0146436 | 6/1988 | Japan | 357/23.7 |

OTHER PUBLICATIONS

Patent Abstracts of Japan, vol. 11, No. 36 (E-477)(2483), Feb. 3, 1987, & JP-A-61-203-682, Sep. 9, 1986, Kimimaro Yoshikawa, "Semiconductor Device and Manufacture Thereof".
IEEE Electron Device Letters, vol. 11, No. 1, pp. 15-17, Jan. 1990, N. Yamauchi, et al., "Unusually Abrupt Switching in Submicrometer Thin-Film Transistors Using a Polysilicon Film With Enhanced Grain Size".
Japanese Journal of Applied Physics, Supplements. Extended Abstracts 22nd Conf. Solid State Devices and Materials, pp. 955-958, 1990, S. Takenaka, et al., "High Mobility Poly-Si TFTs Using Solid Phase Crystallized a-Si Films Deposited by Plasma Enhanced Chemical Vapor Deposition".
Patent Abstracts of Japan, vol. 16, No. 74 (E-1170), Feb. 24, 1992, & JP-A-3-265-142, Nov. 26, 1991, Sato Hajime, et al., "Thin Film Transistor and Manufacture Thereof".

Primary Examiner—Rolf Hille
Assistant Examiner—Peter Toby Brown
Attorney, Agent, or Firm—Oblon, Spivak, McClelland, Maier & Neustadt

[57] ABSTRACT

A polysilicon film pattern of a first conductivity type is formed on one main surface of a substrate. A gate electrode is formed on a predetermined region of the pattern with a gate insulating from interposed therebetween. A source region and a drain region, of a second conductivity type are formed in the upper portions of the pattern. These regions are separated by a region of the pattern located under the gate electrode, and are connected to a source electrode and a drain electrode, respectively. The electrodes are electrically insulated from each other by means of an interlayer insulating film The polysilicon film pattern contains nitrogen, whose concentration is, in that particular region of the polysilicon film pattern which extends from half of the thickness thereof to the bottom thereof, set higher than that of nitrogen inevitably contained in a polysilicon film formed by a CVD method, and set so as to restrain the formation of silicon crystal nuclei Further, the pattern is formed by subjecting an amorphous silicon film having the same nitrogen concentration distribution as above, to a solid-phase growth process.

17 Claims, 3 Drawing Sheets

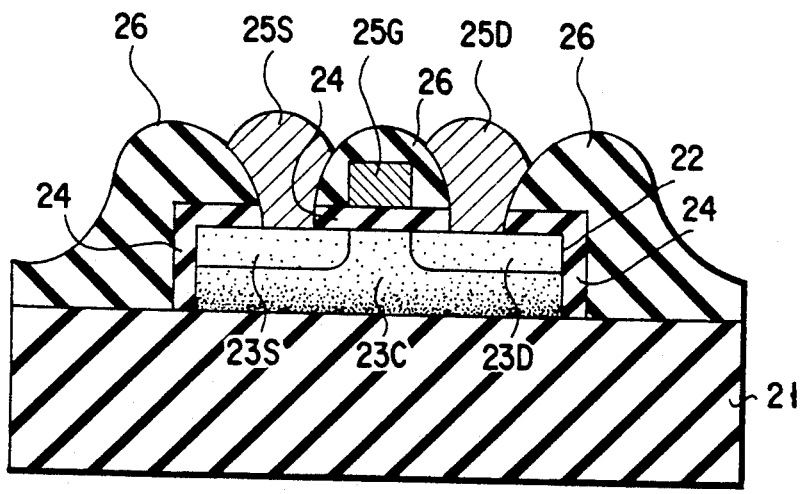
F I G. 2

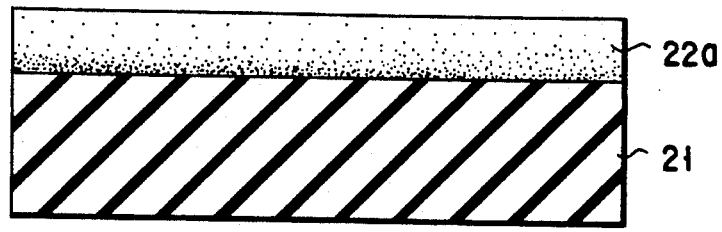
F I G. 3A
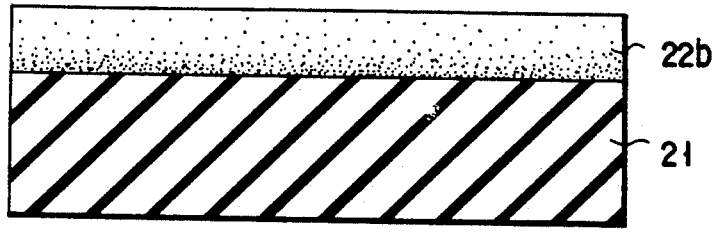
F I G. 3B
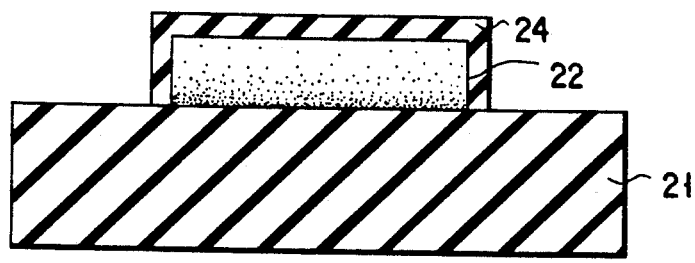
F I G. 3C
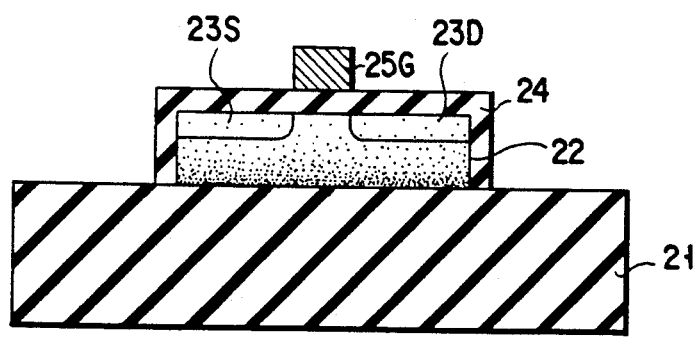
F I G. 3D

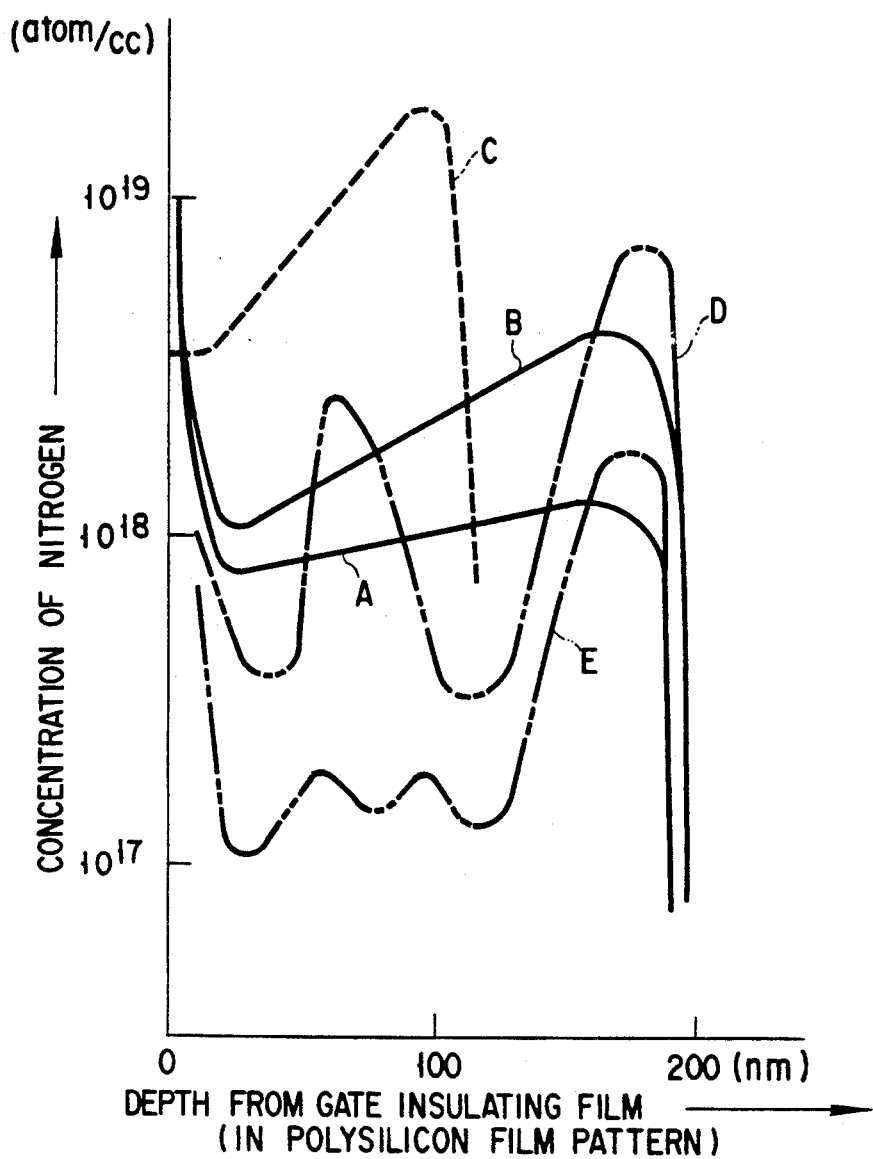
F I G. 4

POLYSILICON THIN FILM SEMICONDUCTOR DEVICE CONTAINING NITROGEN

BACKGROUND OF THE INVENTION

1. Field of the Invention

This invention relates to a semiconductor device having a MIS (Metal Insulator Semiconductor) structure using a polysilicon thin film as a channel layer.

2. Description of the Related Art

A TFT (Thin Film Transistor) serving as a driving element in an active matrix-type liquid-crystal display device, and a MOSFET, etc., are used as conventional polysilicon thin film semiconductor devices of a MIS structure. Here, a top-gate type polysilicon thin film semiconductor device (MOSFET) will be explained with reference to FIG. 1.

In the polysilicon thin film MOSFET of FIG. 1, a gate electrode 15G of a polysilicon film, etc. is provided on a predetermined region of a polysilicon film pattern 12 of a first conductivity type which is formed on a synthetic quartz substrate 11, with a gate insulating film (thermal oxide film) 14 interposed therebetween. A source region 13S of a second conductivity type and a drain region 13D of a second conductivity type are formed in predetermined upper portions of the pattern 12, and a channel-forming region 13C is interposed between the regions 13S and 13D, and formed under the gate electrode 15G. The source and drain regions 13S and 13D are respectively connected to a source electrode 15S of aluminum and a drain electrode 15D of the same. The electrodes 15S, 15D, and 15G are insulated from each other by means of an interlayer insulating film 16 of oxidized silicon. When a voltage is impressed on the gate electrode 15G, a channel layer of a second conductivity type will be formed in the channel-forming region 13C, thereby causing current between the source region 13S and drain region 13D.

In the above-described MOSFET or other semiconductor devices of a MIS structure having a polysilicon thin film serving as a channel layer, the mobility of carriers in the channel layer is larger ten - hundred times than in a semiconductor device having an amorphous silicon thin film serving as a channel layer, in which, for example, an island 12 in the MIS structure is an amorphous silicon thin film pattern.

However, the polysilicon thin film contains a great amount of silicon crystal grains and grain boundaries, and hence a great number of dangling bonds of silicon atoms inevitably exist in the grain boundaries. These dangling bonds trap carriers in the channel layer, so that the mobility of the carriers there is reduced. Further, the threshold voltage of the above semiconductor device is high. Therefore, the conventional polysilicon thin film semiconductor device is impractical.

SUMMARY OF THE INVENTION

It is the object of the invention to provide a polysilicon thin film semiconductor device of a MIS structure using a polysilicon thin film as a channel layer, which has large silicon crystal grains in the thin film, and hence a small number of grain boundaries, thereby reducing the number of silicon dangling bonds in the grain boundaries, thus enhancing a characteristic of the device such as the mobility of carriers in the channel layer.

To attain the object, the polysilicon thin film semiconductor device of the invention comprises:

a polysilicon film pattern formed on a substrate, and containing nitrogen whose concentration is, in that particular region of the polysilicon film pattern which extends from half of a thickness thereof to a bottom thereof, set higher than that of nitrogen inevitably contained in a polysilicon film formed by a CVD method, and set so as to restrain the formation of silicon crystal nuclei;

a gate electrode provided on or under the polysilicon film pattern with a gate insulating film interposed therebetween; and a source electrode and a drain electrode which are connected to the pattern with an interval therebetween.

The invention is characterized in that a polysilicon thin film is employed in the semiconductor device of the MIS structure, which film contains nitrogen whose concentration falls within the above-described range in that particular region of the film which is located close to the substrate. Specifically, the concentration of nitrogen falls within a range of $10^{18}$ atoms/cm$^3$ $10^{20}$ atoms/cm$^3$, and more preferably within a range of $10^{18}$ atoms/cm$^3$ - $10^{19}$ atoms/cm$^3$, in that region of the polysilicon film pattern which extends from half of the thickness thereof to the bottom thereof. On the other hand, the concentration of nitrogen inevitably contained in a polysilicon film formed by a CVD method is approx. $10^{17}$ atoms/cm$^3$.

The above polysilicon film is formed by subjecting the amorphous silicon film, formed on the substrate and having the same nitrogen concentration distribution, to a solid-phase growth process under suitable conditions. At this time, on the side of a region of the film close to the substrate, a nitrogen concentration higher than that of the film formed by the CVD method restrains formation of crystal nuclei in the amorphous silicon film. Thus, the resultant polysilicon film contains, when grown up, large silicon crystal grains, and hence a small number of grain boundaries. Specifically, the polysilicon film obtained by subjecting the growth process to the amorphous silicon film having a conventional nitrogen concentration distribution has silicon crystal grains of a diameter of 100 nm or less, whereas it is estimated that the polysilicon film obtained in the invention has silicon crystal grains of a diameter of approx. 150–250 nm, and preferably, of approx. 200 nm. Further, in the polysilicon film, the termination of nitrogen atoms of a predetermined concentration also reduces the density of silicon dangling bonds, so that a semiconductor device having enhanced characteristics such as a high mobility of carriers, etc., can be obtained.

For example, a MOSFET or TFT is used as the above-described polysilicon thin film semiconductor device of a MIS structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings which are incorporated in and constitute a part of the specification, illustrate presently preferred embodiments of the invention, and together with the general description given above and the detailed description of the preferred embodiments given below, serve to explain the principles of the invention.

FIG. 2 is a cross sectional view, showing a polysilicon thin film semiconductor device of a MIS structure according to an embodiment of the invention;

FIGS. 3A–3D are cross sectional views, useful in explaining the manufacturing process of the device of FIG. 2; and FIG. 4 is a graph, showing the concentration distribution of nitrogen in the thickness direction of each of various polysilicon film patterns in the semiconductor devices according to the invention.

DETAILED DESCRIPTION OF THE PREFERRED EMBODIMENTS

Figure 1:
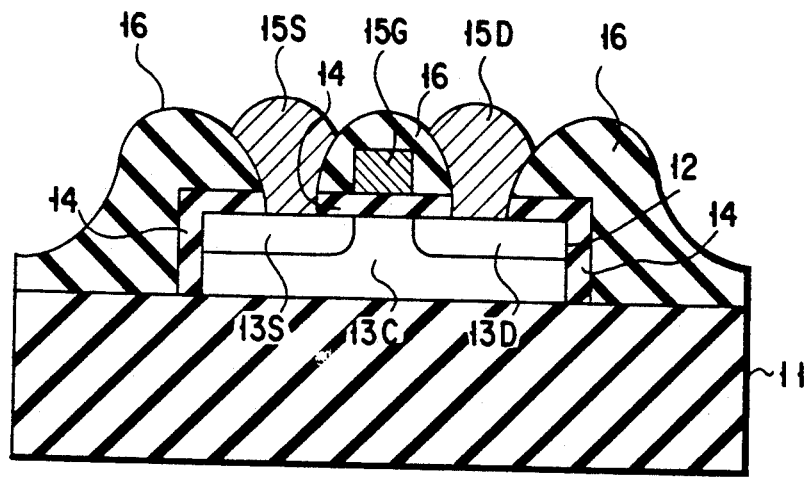
FIG. 1 is a cross sectional view, showing a conventional polysilicon thin film semiconductor device of a MIS structure.

The polysilicon thin film semiconductor device according to the invention will be explained in detail with reference to the accompanying drawings.

FIG. 2 shows a cross section of the polysilicon thin film MOSFET according to the invention. The basic structure of this device is similar to the abovedescribed conventional MOSFET.

Specifically, a polysilicon film pattern 22 of a first conductivity type is formed on one surface of a synthetic quartz substrate 21. A gate electrode 25G of a polysilicon film is provided on a predetermined region of the pattern 22, with gate insulating film (thermal oxide film) 24 interposed therebetween. A source region 23S of a second conductivity type and a drain region 23D of a second conductivity type are formed in predetermined upper portions of the pattern 22, and a channel-forming region 23C is interposed between the regions 23S and 23D, and formed under the gate electrode 25G. The source and drain regions 23S and 23D are respectively connected to a source electrode 25S of aluminum and a drain electrode 25D of the same. The electrodes 25S, 25D, and 25G are insulated from each other by means of an interlayer insulating film 26 of oxidized silicon.

The polysilicon film pattern 22 contains nitrogen, and the concentration of nitrogen, contained in a region of the pattern extending from half of the thickness thereof to the bottom thereof, is set higher than that of nitrogen inevitably contained in a polysilicon film formed by the CVD method, and set so as to restrain the formation of silicon crystal nuclei. In FIG. 2, the concentration distribution of nitrogen in the pattern 22, particularly in the channel-forming region 23C, is shown by the dots.

Then, the method of manufacturing the semiconductor device (MOSFET) will be explained in detail with reference to FIGS. 2, and 3A–3D.

In a first step, an amorphous silicon film 22a of a thickness of about 200 nm is deposited on the synthetic quartz substrate 21 by a mercury sensitized photo CVD method. The film 22a contains nitrogen whose concentration is set higher than that of nitrogen inevitably contained in a polysilicon film formed by the CVD method, and set so as to restrain the formation of silicon crystal nuclei, in a region of the film 22a extending from half of the thickness thereof to the bottom thereof. The forming of an amorphous silicon film by the mercury sensitized photo CVD method is disclosed in detail by T. Kamimura, et al: Jpn. J. Appl. Phys., Vol. 25, No. 12 (1986), pp 1778-1782. More specifically, a mixture of SiH$_4$ and NH$_3$ is used as a reaction gas for CVD to be applied to the substrate, and H$_2$ is used as a carrier gas. The temperature of the quartz substrate is set to 200°–300° C. The light-wavelength of a low pressure mercury lamp is set to 254 nm, and the illumination intensity thereof is set to 7–20 mW/cm$^2$. The temperature of a mercury reservoir is set to a value falling within a range of 50°–100° C. The supply amount of SiH$_4$ is set, through the overall film, to a constant value falling within a range of 10–50 sccm, while that of NH$_3$ is set to a value falling within a range of $10^{-4}$–$10^{-8}$ of the amount of SiH$_4$ and reduced with the lapse of time during deposition of film. (FIG. 3A)

Though the substrate is formed of a synthetic quartz in the embodiment, it may be formed by growing a thermal oxide film on a silicon wafer.

Further, in the first step, the amorphous silicon film may be formed as follows: In the mercury sensitized photo CVD method, only SiH$_4$ is used as the reaction gas, and an amorphous silicon film is deposited on the synthetic quartz substrate 21 without intentionally implanting nitrogen ions into the film. Subsequently, nitrogen ions are implanted into the amorphous silicon film so as to make the concentration of nitrogen set higher than that of nitrogen inevitably contained in a polysilicon film formed by the CVD method, and set so as to restrain the formation of silicon crystal nuclei, in a region of the amorphous silicon film extending from half of the thickness thereof to the bottom thereof, thereby forming an amorphous silicon film similar to the aforementioned amorphous silicon film 22a. In this case, silicon ions may be implanted into the film, together with nitrogen ions, so as to enhance the efficiency of implantation of the nitrogen ions. This facilitates forming of such an amorphous silicon film which has a maximum concentration of nitrogen in the vicinity of the boundary face between the film and the substrate 21.

Moreover, in the first step, an amorphous silicon film 22a may be formed by the mercury sensitized photo CVD method using a mixture gas of SiH$_4$ and NH$_3$, and then implanting nitrogen ions into the film, thereby forming an amorphous silicon film having a maximum concentration of nitrogen in the vicinity of the boundary face between the film and the substrate 21.

In addition, in the first step, the amorphous silicon film may be formed by a plasma CVD method, a decompression CVD method, or a normal pressure CVD method, in place of the mercury sensitized photo CVD method. Further, after an amorphous silicon film or a polysilicon film is formed by one of the above CVD methods, silicon ions may be implanted into the film, thereby obtaining a desired amorphous silicon film. Furthermore, as described above, in a case where first an amorphous silicon film is formed without implanting nitrogen ions, further implanting silicon ions may be performed by a sputtering method, an electron beam deposition method, or the above CVD methods.

Then, in a second step, the amorphous silicon film 22a is annealed in a furnace at 600° C. for 60 hours, thereby crystallizing amorphous silicon and activating nitrogen contained in the film. Subsequently, an impurity of a first conductivity type is doped into the film under suitable conditions, thereby forming the polysilicon film 22b of the same type. (FIG. 3B)

The annealing in the second step is not limited to one in a furnace, but may be electron annealing, laser annealing, or lamp annealing.

Thereafter, in a third step, the polysilicon film 22b is selectively etched to obtain the polysilicon film pattern 22 of a first conductivity type having a desired contour. Then, a thermal oxide film 24 as a gate insulating film is formed on the pattern 22 so as to surround it. (FIG. 3C)

In a fourth step, the polysilicon gate electrode 25G is formed on predetermined region of the pattern 22, with the gate insulating film 24 (thermal oxide film) interposed therebetween. Subsequently, an impurity of a second conductivity type is doped into those two regions in the pattern 22 which are separated by an intermediate region thereof located under the gate 25G, thereby forming the source region 23S of a second conductivity type and the drain region 23D of the same type with self alignment. (FIG. 3D)

In a fifth step, an interlayer insulating film 26 is formed on the resultant structure. Then, contact holes (not shown) are formed in those regions of the films 24 and 26 which are located on the source and drain regions 23S and 23D, followed by forming the source electrode 25S and drain electrode 25D which are respectively connected to the regions 23S and 23D, and completing the polysilicon thin film semiconductor device of FIG. 2.

FIG. 4 shows the concentration distribution of nitrogen contained in that region of the polysilicon film pattern 22 of each of some semiconductor devices (MOSFETs) manufactured in the above-described method which extends in the thickness direction. The distribution was measured by a SIMS (Secondary Ion Mass Spectrometry). In FIG. 4, the abscissa indicates the depth measured from the boundary face between the pattern 22 and gate insulating film 24, while the ordinate indicates the concentration of nitrogen. Curves A, B, D, and E indicate a case where the entire thickness of the pattern 22 is 200 nm, and curve C indicates a case where that is 110 nm.

In the case providing curve A, the concentration of nitrogen in a region of the pattern 22 extending from half of the thickness thereof to the bottom thereof (i.e., in a region extending from 100 nm deep from the boundary face between the gate insulating film 24 and pattern 22 to 200 nm deep), is set higher than $10^{17}$ atoms/cm$^3$ which is the concentration of nitrogen inevitably contained in a polysilicon film formed by the CVD method. Further, in the pattern 22, the nearer to the substrate the portion is, the higher the concentration of nitrogen contained in it is. In a portion having a depth of 100-200 nm from the boundary face between the gate insulating film 24 and the pattern 22, the nitrogen concentration has a maximum value falling within a range of $10^{18}$ atoms/cm$^3$ - $10^{19}$ atoms/cm$^3$. Also in the case providing the curve B, and in the case providing the curve C where the entire thickness of the pattern 22 differs from that of the former, the concentration distribution of nitrogen is similar to that in the above-described case, though the values of each of the curves B and C are higher than those of the curve A, respectively.

In the polysilicon thin film semiconductor device of the invention, when its polysilicon film pattern has such a concentration distribution of nitrogen in the depth direction thereof as indicated by the curves A and B, good stress balance is obtained, so that the channel layer can be prevented from being greatly deteriorated, and hence superior characteristics obtained from the device.

On the other hand, in the cases providing the curves D and E, the implanting amount of nitrogen is increased and reduced in the thickness direction of the pattern 22, and the concentration of nitrogen falls within a range of $10^{18}$ atoms/cm$^3$ - $10^{19}$ atoms/cm$^3$ in a region having a depth of 100-200 nm.

As is described above, in the polysilicon thin film semiconductor device of the invention, the concentration of nitrogen falls within a range of $10^{18}$ atoms/cm$^3$ $10^{19}$ atoms/cm$^3$ in that region of the pattern 22 which extends from half of the thickness thereof to the bottom thereof. However, in actuality, the concentration may fall within a range of $10^{18}$ atoms/cm$^3$ - $10^{20}$ atoms/cm$^3$. If it is lower than $10^{18}$ atoms/cm$^3$, formation of silicon crystal nuclei will not be sufficiently restrained, which makes it difficult to grow into large crystal grains. If, on the other hand, the concentration is higher than $10^{20}$ atoms/cm$^3$, nitrogen may damage silicon crystal nuclei, and hence the characteristics of the channel layer are deteriorated. To effectively restrain formation of silicon crystal nuclei, and to enhance the characteristics of the channel-forming region, it is more desirable to set the concentration of nitrogen to a value falling within a range of $10^{18}$ atoms/cm$^3$ - $10^{19}$ atoms/cm$^3$.

Moreover, in the polysilicon thin film semiconductor device of the invention, if the concentration of nitrogen in that region of the polysilicon film pattern which extends from the upper surface thereof to half of the thickness thereof (e.g. in that region of the channel-forming region which is close to the gate insulating film 24 in the device shown in FIG. 2) exceeds $10^{19}$ atoms/cm$^3$, nitrogen may damage the silicon crystal nuclei, so that the characteristics of the polysilicon film may not be enhanced.

In FIG. 4, it is considered that what makes the concentration of nitrogen high in the vicinity of the boundary face between the polysilicon film pattern and gate insulating film is noise caused when the concentration is measured by the SIMS.

Now, the characteristics of the polysilicon thin film semiconductor device of FIG. 2 will be explained in detail.

The characteristics of a MOSFET having the above-described MIS structure were examined. The diameter of each silicon crystal grain was about 200 nm, and the density of spins, i.e., a character value of silicon dangling bonds, was $7 \times 10^{17}$ spins/cm$^3$. In a case where the semiconductor device was formed as an n-type channel MOS, i.e., where the source region 23S and drain region 23D were n-type regions in the structure of FIG. 2, the field effect mobility was 70 cm$^2$/Vs, and the threshold voltage 5.6V. In a case where the semiconductor was formed as a p-type channel MOS, i.e., where the source region 23S and drain region 23D were p-type regions, the field effect mobility was 34.5 cm$^2$/Vs, and the threshold voltage −5.9V.

Further, a polysilicon thin film semiconductor device (MOSFET) was manufactured as a comparison sample. This device was formed in a method similar to that shown in FIGS. 3A-3D, except that NH3 was not introduced when the amorphous silicon film was formed in the first step. The concentration of nitrogen was not more than approx. $10^{17}$ atoms/cm$^3$ all through the thickness of the polysilicon film, the diameter of each silicon crystal grain 94 nm, and the density of spins $1 \times 10^{18}$ spins/cm$^3$. Also, in a case where the semiconductor device was formed as an n-type channel MOS, the field effect mobility was 10 cm$^2$/Vs, and the threshold voltage 6.45V. In a case where the semiconductor was formed as a p-type channel MOS, the field effect mobility was 10 cm$^2$/Vs, and the threshold voltage −6.4V.

As is evident from the above, in the semiconductor device of the invention, silicon crystal grains have large diameters, and the density of dangling bonds is low. Accordingly, the field effect mobility in the channel layer is high, and the threshold voltage is low.

Although the invention is applied to the top-gate type polysilicon thin film semiconductor device of the MIS structure in the embodiment, it is not limited to the device. That is, a bottom-gate type semiconductor device of a MIS structure, a TFT of a stagger type or reverse stagger type may have a polysilicon thin film of the concentration distribution of nitrogen as described above.

As described above, in the polysilicon thin film semiconductor device of a MIS structure according to the present invention, a particular region of the polysilicon film extending in the thickness direction thereof has a predetermined concentration distribution of nitrogen, so that formation of silicon crystal nuclei is restrained, thereby reducing the number of grain boundaries, reducing the density of dangling bonds, increasing the field effect mobility, and reducing the threshold voltage in a channel layer.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A polysilicon thin film semiconductor device comprising:
   a polysilicon film pattern formed on a substrate, and containing nitrogen whose concentration is, in that particular region of the polysilicon film pattern which extends from half of a thickness thereof to a bottom thereof, set within a range of $10^{18}$ atoms/cm$^3$ – $10^{19}$ atoms/cm$^3$ so as to restrain the formation of silicon crystal nuclei;
   a gate electrode provided on a gate insulating film, said insulating film interposed between said gate electrode and said polysilicon film pattern; and
   a source electrode and a drain electrode which are connected to the pattern such that said source and drain electrodes are separated from one another by said ge electrode and said gate insulating film.

2. The polysilicon thin film semiconductor device according to claim 1, wherein the polysilicon film pattern is formed by a process including the step of subjecting an amorphous silicon film having the same concentration distribution of nitrogen as the resultant polysilicon film pattern, to a solid-phase growth process.

3. The polysilicon thin film semiconductor device according to claim 1, wherein the concentration of nitrogen in the polysilicon film pattern has a maximum value in the vicinity of the boundary face between the substrate and pattern.

4. The polysilicon thin film semiconductor device according to claim 1, wherein the concentration of nitrogen in the polysilicon film pattern has a maximum value in a region of the pattern having a thickness of 0 to 80Å from the bottom surface thereof upward.

5. The polysilicon thin film semiconductor device according to claim 1, wherein the concentration of nitrogen in the polysilicon film pattern increases with increasing distance from the upper surface thereof.

6. The polysilicon thin film semiconductor device according to claim 1, wherein the polysilicon film pattern is a semiconductor layer of a first conductivity type having a source region and a drain region of a second conductivity type formed in the upper portion thereof with a channel-forming region interposed therebetween, the gate electrode being provided on said gate insulating film, said gate insulating film interposed between said gate electrode and said channel-forming region, the source electrode and drain electrode being connected to the source region and drain region, respectively.

7. The polysilicon thin film semiconductor device according to claim 1, wherein the gate electrode is connectively formed on the gate insulating film, and the source electrode and drain electrode are respectively connected to regions of the polysilicon film pattern with a region of the pattern located under the gate electrode interposed therebetween.

8. The polysilicon thin film semiconductor device according to claim 1, wherein the diameter of a silicon crystal grain in the polysilicon film pattern falls within a range of 150–250 nm.

9. The polysilicon thin film semiconductor device according to claim 2, wherein the amorphous silicon film is formed by a CVD method using a reaction gas comprising SiH$_4$ and NH$_3$.

10. The polysilicon thin film semiconductor device according to claim 2, wherein the amorphous silicon film is formed by depositing the film by a CVD method using a reaction gas comprising of SiH$_4$ and NH$_3$, and then implanting nitrogen ions into the deposited film.

11. The polysilicon thin from semiconductor device according to claim 1, wherein the concentration of nitrogen in the polysilicon from pattern extending from the upper surface thereof to less than half the thickness thereof is less than the concentration o nitrogen in the region extending from half a thickness thereof to a bottom thereof.

12. The polysilicon thin film semiconductor device according to claim 1, wherein said substrate is made of synthetic quartz.

13. A polysilicon thin film semiconductor device comprising:
   a polysilicon film pattern of a first conductivity-type formed on a substrate, having a thickness of 100–200 nm, and containing nitrogen whose concentration falls within a range of $10^{18}$ atoms/cm$^3$ – $10$ atoms cm$^3$ in that region of the polysilicon film pattern which extends from half of a thickness thereof to a bottom thereof;
   a gate electrode formed on a gate insulating film, said gate insulating film interposed between said gate electrode and said polysilicon film pattern;
   a source region and a drain region of a second conductivity type are separated form each other by means of a region of the pattern located under the gate electrode; and
   a source electrode and a drain electrode connected to the source and drain regions, respectively.

14. The polysilicon thin film semiconductor device according to claim 13, wherein the polysilicon film pattern is formed by a process including the step of subjecting an amorphous silicon film having the same nitrogen concentration distribution as the resultant polysilicon film pattern, to a solid-phase growth process.

15. The polysilicon thin film semiconductor device according to claim 13, wherein the concentration of nitrogen in the polysilicon film pattern extending from the upper surface thereof to less than half the thickness thereof is less than the concentration of nitrogen in the region extending from half a thickness thereof to a bottom thereof.

16. The polysilicon thin film semiconductor device according to claim 13, wherein said substrate is made of synthetic quartz.

17. The polysilicon thin film semiconductor device according to claim 13, wherein said source and drain regions are formed in an upper portion of said polysilicon from pattern.

* * * * *